United States Patent [19]

Koike

[11] Patent Number: 5,600,587
[45] Date of Patent: Feb. 4, 1997

[54] FERROELECTRIC RANDOM-ACCESS MEMORY

[75] Inventor: Hiroki Koike, Tokyo, Japan

[73] Assignee: Nec Corporation, Tokyo, Japan

[21] Appl. No.: 593,686

[22] Filed: Jan. 29, 1996

[30] Foreign Application Priority Data

Jan. 27, 1995 [JP] Japan .................................. 7-011357

[51] Int. Cl.$^6$ .................................................. G11C 11/22
[52] U.S. Cl. ........................ 365/145; 365/149; 365/203; 365/230.03
[58] Field of Search ..................................... 365/145, 149, 365/203, 230.03

[56] References Cited

U.S. PATENT DOCUMENTS

| 4,873,664 | 10/1989 | Eaton, Jr. | 365/145 |
| 5,086,412 | 2/1992 | Jaffe et al. | 365/145 |
| 5,467,302 | 11/1995 | Hirano et al. | 365/145 |
| 5,495,440 | 2/1996 | Asakura | 365/149 |

FOREIGN PATENT DOCUMENTS

| 1158691 | 6/1989 | Japan . |
| 2110895 | 4/1990 | Japan . |

OTHER PUBLICATIONS

ISSCC (International Solid–State Circuits Conference) Digest of Technical Papers, Feb. 1994, pp. 268–269.

*Primary Examiner*—Son T. Dinh
*Attorney, Agent, or Firm*—Sughrue, Mion, Zinn, Macpeak & Seas

[57] ABSTRACT

The invention provides a nonvolatile random-access memory using memory cells consisting of a ferroelectric capacitor and a switching transistor. The memory has two memory blocks each of which has memory cells arranged in rows and columns, word lines, bit lines, a plate line, sense amplifiers and reference voltage generators. The memory includes a plate line voltage control circuit which impresses supply voltage to the plate line of one memory block and ground potential to the plate line of the other memory block during a transition period preceding to read or write operation and then connects the two plate lines to thereby keep the connected plate lines at an intermediate voltage between supply voltage and ground potential. To retard fatigue of the ferroelectric material by repeated polarization in positive and negative directions, the memory can optionally be operated in a volatile mode.

7 Claims, 5 Drawing Sheets

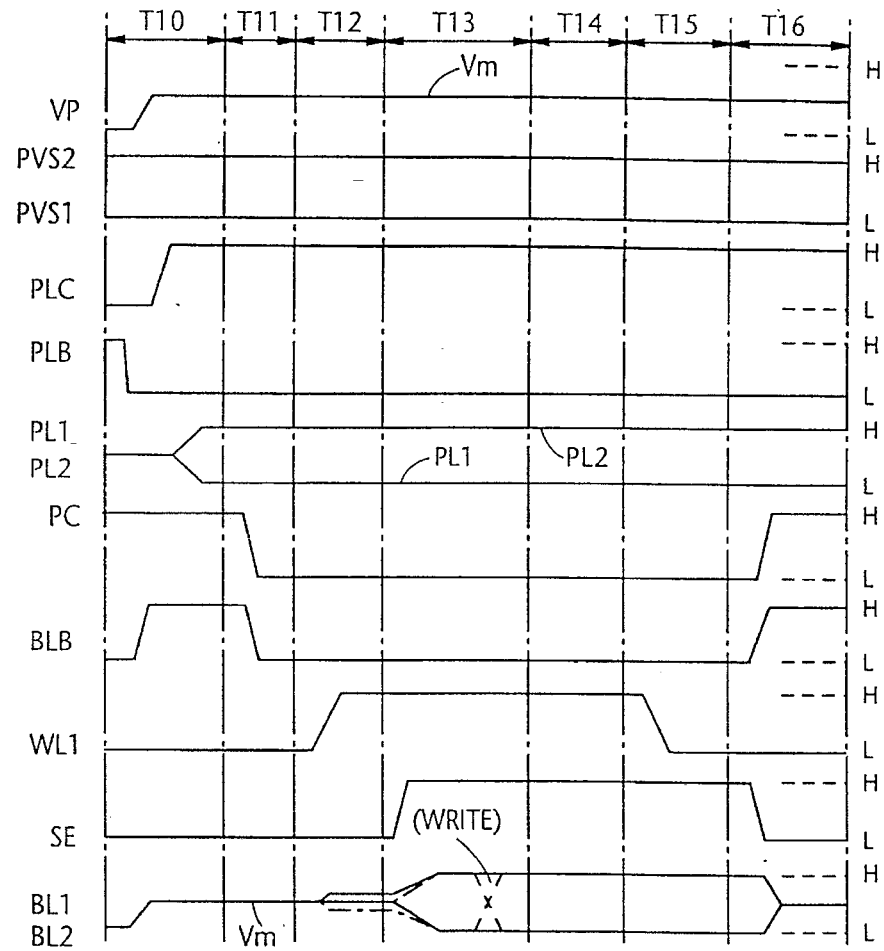

FERROELECTRIC RANDOM-ACCESS MEMORY

BACKGROUND OF THE INVENTION

This invention relates to a ferroelectric random-access memory.

It is known to use a ferroelectric capacitor as the principal part of a nonvolatile memory cell, namely, a memory cell that retains the stored data even though the power is turned off. A ferroelectric material, represented by lead zirconate titanate (PZT), is very high in relative permittivity (dielectric constant), makes spontaneous polarization and possesses hysteresis of polarization with changes in the direction of polarization. A ferroelectric capacitor has a ferroelectric film sandwiched between a pair of electrode plates.

Nonvolatile ferroelectric random-access memories are described, for example, in U.S. Pat. No. 4,873,664, JP-A 1-158691 and ISSCC (International Solid-State Circuits Conference) Digest of Technical Papers, Feb. 1994, pp. 268–269. Known ferroelectric memories use either a 1T/1C memory cell consisting of a ferroelectric capacitor and a field effect transistor or a 2T/2C memory cell having two ferroelectric capacitors and two field effect transistors. In general, the 1T/1C cell is preferable for enhancement of the level of integration.

FIG. 1 shows a 1T/1C memory cell 10 having a ferroelectric capacitor 12 and a field effect transistor 14 for switching. One electrode plate of capacitor 12 is coupled to a bit line BL by the source-drain path of transistor 14, and the other plate of the capacitor is coupled to a plate line PL. The gate electrode of transistor 14 is coupled to a word line WL.

Capacitor 12 can store either logic "1" or logic "0" according to the state of polarization of the ferroelectric material (not shown) between the two plates. FIG. 2 shows a hysteresis loop of polarization of the ferroelectric in capacitor 12. The abscissa represents external voltage V applied across the two plates of the capacitor, and the ordinate represents polarization charge Q on the ferroelectric between the two plates. The ferroelectric assumes a stable state at point A on the hysteresis loop and another stable state at point E. So, point A can represent logic "0", and point E can represent logic "1". When a voltage $-V_e$ is applied across the two plates of capacitor 12 while transistor 14 is conducting, the charge stored in the capacitor is fed out onto bit line BL. The amount of the charge is $Q_0$ if the ferroelectric is in the state at point A, and $Q_1$ if the ferroelectric is in the state at point E. A resulting change in voltage on the bit line is detected by a sense amplifier, which is a differential amplifier, by comparison with a reference voltage which is impressed on another bit line (not shown). The reference voltage is intermediate between a voltage developed on bit line BL by the charge $Q_1$ and another voltage developed on bit line BL by the charge $Q_0$.

As a result of the transfer of charge $Q_1$ or $Q_0$ from capacitor 12 to bit line BL, the polarization state of the capacitor changes to point H in FIG. 2, meaning that the originally stored data is lost. The lost data is regenerated by applying a positive voltage $V_e$ or 0 volt across capacitor 12.

FIG. 7 shows a 2T/2C memory cell 10A having two ferroelectric capacitors 12, 12' and two transistors 14, 14'. Capacitor 12 is coupled to a bit line BL1 via the source-drain path of transistor 14, and capacitor 12' to another bit line BL2 via the source-drain path of transistor 14'. A word line WL is common to the two transistors, and a plate line PL is common to the two capacitors. In this memory cell the two capacitors are forced to polarize in opposite directions. For example, the memory cell stores logic "1" when the polarization state of capacitor 12 is at point E in FIG. 2 while the state of capacitor 12' is at point A, and stores logic "0" when the states of the two capacitors are reverse. When a voltage $-V_e$ is applied across the two plates of the both capacitors while, for example, the memory cell stores logic "1", charge $Q_1$ is fed from capacitor 12 onto bit line BL1 and charge $Q_0$ from capacitor 12' onto bit line BL2. A resulting voltage difference between bit lines BL1 and BL2 is detected and amplified by a sense amplifier. When charges $Q_1$ and $Q_0$ move onto bit lines BL1 and BL2, the polarization state of both capacitors 12 and 12' changes to point H in FIG. 2, meaning loss of the originally stored data. To regenerate the lost data, a positive voltage $V_e$ and 0 volt are applied to capacitors 12 and 12', respectively.

In known ferroelectric memories, positive and negative voltages are alternately applied across the two plates of the capacitor(s) of the accessed memory cells to read out the stored data and regenerating the data. For this purpose, it is usual to shift the plate line potential from low level to high level or reversely by proper clocking. However, for the following reason, clocking of the plate line potential is unfavorable for enhancement of operation speed. Ferroelectric capacitors have large capacitance values since ferroelectric materials have large dielectric constants. In practice, plate line is a metal film which is usually formed of a noble metal such as Au, Pt or Ru in view of compatibility with ferroelectric materials. The thickness of plate line film is limited because thick films of these noble metals are rather inferior in processability, whereas enlargement of the plate line width is against the desire for higher integration of memory cells. So, plate line has a relatively large resistance value and, coupled with ferroelectric capacitors having large capacitance values, has a relatively large time constant. Therefore, time lags needed for clocking of the plate line potential become significant. Besides, relatively large power is consumed for shifting the plate line potential.

To obviate the above disadvantages, there are proposals of fixing the plate line potential at a suitable level. For example, JP-A 2-110895 proposes the following technique.

The plate line potential is always fixed at an intermediate voltage between low level (ground potential) and high level (level of supply voltage). During standby periods, bit lines (or bit line pairs) are kept at the intermediate voltage. In reading operation, the voltage on bit line (or bit line pair) for the accessed memory cell is shifted to low level or high level to impress a voltage $-V_e$ or $+V_e$ across the two plates of the capacitor to thereby transfer a charge corresponding to the state of polarization from the capacitor to bit line. After that the data is regenerated by applying a voltage in the reverse direction to the capacitor, and then the voltage on bit line is shifted to the intermediate voltage.

In this case it is necessary to continuously produce the intermediate voltage by treating supply voltage and to supply the produced voltage to plate line. Therefore, a considerable increase in power consumption is inevitable.

In ferroelectric memories, read and/or write operations cause reversals of the direction of polarization of the ferroelectric material in the capacitors. A reversal of the direction of polarization means that the state of polarization moves from point F (in FIG. 2) to point G or from point B to point C. In most of known ferroelectric capacitors, the amount of charge that can be taken out of the capacitor ($Q_1$ in FIG. 2) decreases as reversals of the direction of polarization are repeated innumerable times. This phenomenon is called fatigue of ferroelectric film. If the fatigue becomes significant, the stored data is destructed.

To retard fatigue of the ferroelectric in ferroelectric memories, it is possible to operate the memory without causing reversal of the direction of polarization on condition that the power is kept on. In this method, the state of polarization of the capacitor of the 1T/1C memory cell of FIG. 1 is, for example, at point D (in FIG. 2) to store logic "1" and at point E to store logic "0". The plate line potential is fixed to ground potential (or supply voltage), and the bit line BL is precharged to a voltage intermediate between supply voltage and ground potential together with a complementary bit line which is not coupled to the selected memory cell. Transistor 14 is turned on after interrupting precharging of bit lines. Then a current flows out of the capacitor onto bit line BL if the stored data is logic "1", and a current flows from bit line BL into the capacitor if the stored data is logic "0". A resulting change in the voltage on bit line BL is detected by comparison with the intermediate voltage on the complementary bit line. By this read operation the state of polarization of the capacitor moves from point D or E to point C, and the original state of point D or E is resumed when the voltages on bit line BL and the complementary bit line are shifted to supply voltage and ground potential, respectively.

In this method the voltages across the capacitor are always in a specific direction. Therefore, there occurs no reversal of the direction of polarization of the ferroelectric. That is, the ferroelectric capacitor acts as an ordinary dielectric capacitor, and the memory cell functions in the same manner as memory cells of a conventional DRAM. This method is operating ferroelectric memory cells in a volatile mode since the stored data is destructed if the power is turned off. That is, if the voltage across the capacitor becomes 0, the state of polarization moves to point E irrespective of the original state, and hence it becomes impossible to discriminate between logic "1" and logic "0".

SUMMARY OF THE INVENTION

It is an object of the present invention to provide a ferroelectric random-access memory which is high in operation speed and low in power consumption and operates in a nonvolatile mode.

A further object of the invention is to provide a ferroelectric random-access memory which is high in operation speed and low in power consumption and can be operated in a nonvolatile mode and in a volatile mode to retard fatigue of the ferroelectric material.

A ferroelectric random-access memory according to the invention comprises first and second memory blocks each of which comprises a plurality of memory cells arranged in rows and columns. Each memory cell comprises a ferroelectric capacitor having first and second electrode plates and a ferroelectric material interposed between the two electrode plates and a field effect transistor which is coupled at the source or drain to the first electrode plate of the capacitor. Each memory cell further comprises a plurality of word lines each of which is arranged along a row of memory cells and is coupled to the gate of the transistor in a plurality of memory cells in the row, a plurality of bit lines each of which is arranged along a column of memory cells and is coupled to the drain or source of the transistor in a plurality of memory cells in the column and a plate line which is coupled to the second electrode plate of the capacitor in every memory cell of the memory block. Furthermore, each memory cell comprises a precharging means for precharging the bit lines to one of first and second voltages which respectively correspond to the two levels of binary data, a plurality of sense amplifiers each of which senses a difference between a reference voltage and a signal voltage developed on a bit line by an accessed memory cell and amplifies the difference voltage to one of the first and second voltages and a balancing means for temporarily keeping the bit lines at an intermediate voltage between the first and second voltages after the amplification of the difference voltage. The memory further comprises a plate line voltage control means for keeping the plate line of each memory block at one of the first and second voltages during standby periods, changing the voltage on the plate line of one of the two memory block to the other of the first and second voltages and connecting the plate lines of the two memory blocks during a transition period preceding to an operation period to thereby keep the connected plate lines at the aforementioned intermediate voltage and disconnecting the plate lines in a standby period following the operation period.

According to the invention the memory becomes high in operation speed and low in power consumption because the plate line potential is fixed at a voltage intermediate between the aforementioned first and second voltages (ground potential and supply voltage in most cases) to avoid clocked shifts of the plate line potential. Power consumption is further reduced because the intermediate voltage for the plate lines is produced by connecting the two plate lines which have been kept at the first and second voltages, respectively.

The memory is nonvolatile in principle. However, to retard fatigue of the ferroelectric material in the capacitors it is an option to provide the memory with auxiliary control means for operating the memory in a volatile mode without causing reversals of the direction of polarization of the ferroelectric material.

BRIEF DESCRIPTION OF THE DRAWINGS

FIG. 6 is a timing diagram illustrating of the operation of the memory of FIG. 3 in a volatile mode.

DESCRIPTION OF THE PREFERRED EMBODIMENTS

Figure 1:
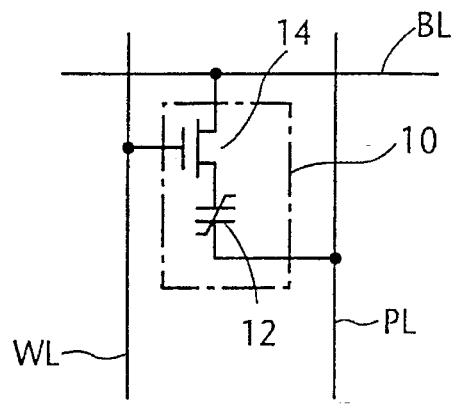
FIG. 1 is a circuit diagram of a memory cell used in this invention.
Figure 2A:
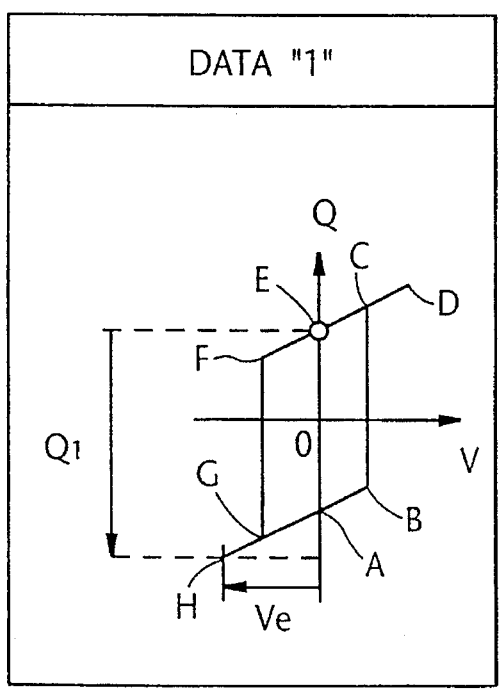
FIG. 2 illustrates the hysteresis of polarization in the ferroelectric capacitor in the memory cell of FIG. 1.
Figure 2B:
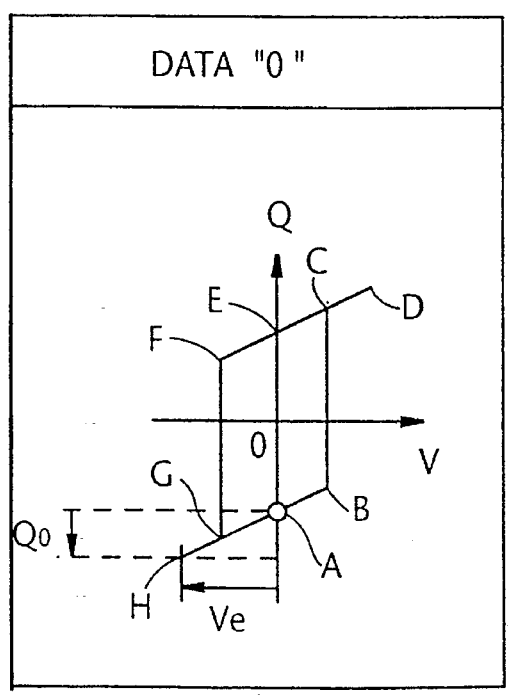
Figure 3:
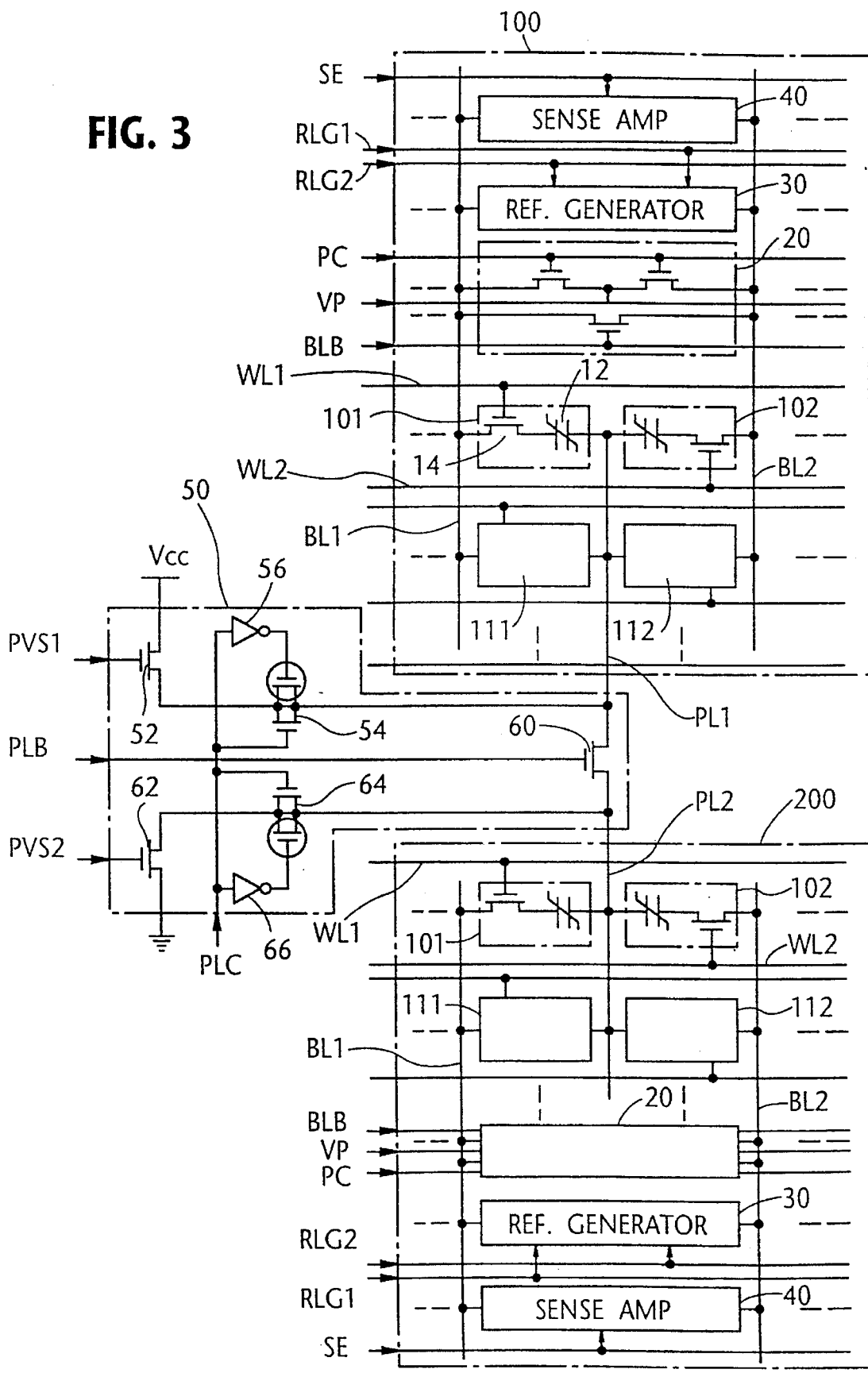
FIG. 3 is a circuit diagram of a memory embodying the present invention.

FIG. 3 shows the principal part of a random-access memory as an embodiment of the invention. The memory has first and second memory blocks 100 and 200 each of which contains a suitable number of memory cells 101, 102, 111, 112, etc. arranged in rows and column. The memory cells are of the 1T/1C type shown in FIG. 1. The two memory blocks 100 and 200 are identical in construction.

In each row of memory cells, two adjacently positioned memory cells, e.g. 101 and 102, constitute a memory cell pair. That is, the memory cell array in each memory block 100, 200 consists of a suitable number of memory cell pairs arranged in rows and columns. For convenience of description, the two memory cells 101 and 102 will be referred to as first and second memory cells, respectively. The second memory cell 102 is arranged inverse to the first memory cell 101. There are two word lines WL1 and WL2 for each row of memory cell pairs, and the first and second memory cells 101 and 102 are coupled to word lines WL1 and WL2, respectively, at the gate of the access transistor 14. There are a pair of bit lines BL1 and BL2 for each column of memory cell pairs, and the first and second memory cells 101 and 102 are coupled to the bit lines BL1 and BL2, respectively, at the source or drain of the transistor 14. Both the first and second memory cells 101 and 102 are coupled to a plate line (PL1 in the first memory block 100 or PL2 in the second memory block 200) at one electrode plate of the capacitor 12. Accordingly, either of the first and second memory cells 101 and 102 in a memory cell pair is selectively accessible.

For each column of memory cell pairs there is a precharge and balance circuit 20 which receives a precharge control signal PC and precharges the two bit lines BL1, BL2 to a predetermined voltage, which is one of first and second voltages corresponding to high and low levels of the binary data. In this embodiment the predetermined voltage is either supply voltage $V_{cc}$ or ground potential. The circuit 20 includes a balancing circuit which connects the two bit lines BL1 and BL2 in response to a command signal BLB and keeps the bit lines BL1, BL2 at an intermediate voltage between the aforementioned first and second voltages.

For each column of memory cell pairs there is a reference level generation circuit 30 which provides a reference level to one of bit lines BL1 and BL2; that is, to bit line BL2 in response to a command signal RLG1 when the first memory cell 101 is accessed via bit line BL1, and to bit line BL1 in response to another command signal RLG2 when the second memory cell 102 is accessed via bit line BL2.

For each column of memory cell pairs there is a sense amplifier 40 which is activated by an activation signal SE. The activated sense amplifier 40 detects a difference between output data level on the bit line (BL1 or BL2) connected to the accessed memory cell (101 or 102) and the reference level on the other bit line (BL2 or BL1) and amplifies the difference voltage to one of the first and second voltages mentioned above.

The memory includes a plate line voltage control circuit 50 to control voltages on plate lines PL1 and PL2. The control circuit 50 has a transistor 52 to which supply voltage $V_{cc}$ is applied at the source, and another transistor 62 of which the source is grounded. A voltage supply signal PVS1 for plate line PL1 is supplied to the gate of the transistor 52, and another voltage supply signal PVS2 for plate line PL2 to the gate of the transistor 62. A transfer gate 54 coupled with an invertor 56 controls the connection of the drain of the transistor 52 to plate line PL1 in response to a voltage supply control signal PLC, and another transfer gate 64 coupled with an invertor 66 controls the connection of the drain of the transistor 62 to plate line PL2 in response to the control signal PLC. The control circuit 50 includes a switching transistor 60 of which the source-drain path is connected between two lines PL1 and PL2. A switching signal PLB is applied to the gate of the transistor 60 to connect or disconnect two plate lines PL1 and PL2.

During standby periods, the control circuit 50 keeps plate lines PL1 and PL2 at one of the first and second voltages mentioned above (usually at ground potential). In a transition period between a standby period and an operation period, one of the first and second voltages is applied to one of plate lines PL1 and PL2 and the other voltage to the other plate line, and then plate lines PL1 and PL2 are connected by turning on the transistor 60. As a result, the connected plate lines PL1 and PL2 are kept at an intermediate voltage between the first and second voltage. In another transition period between the operation period and a standby state, plate lines PL1 and PL2 are disconnected and driven back to one of the first and second voltages.

The control signals PC, BLB, SE, PVS1, PVS2 and PLC can be individually changed at predetermined timing from high level (level of supply voltage) to low level (level of ground potential) and reversely. Selected one of word lines WL1 and WL2 for each row of memory cell pairs can be activated to high level and back to low level at predetermined timing. These shifts are made by well known control circuits (not shown in FIG. 3).

The memory of FIG. 3 can be used in either a nonvolatile mode or a volatile mode.

Figure 4:
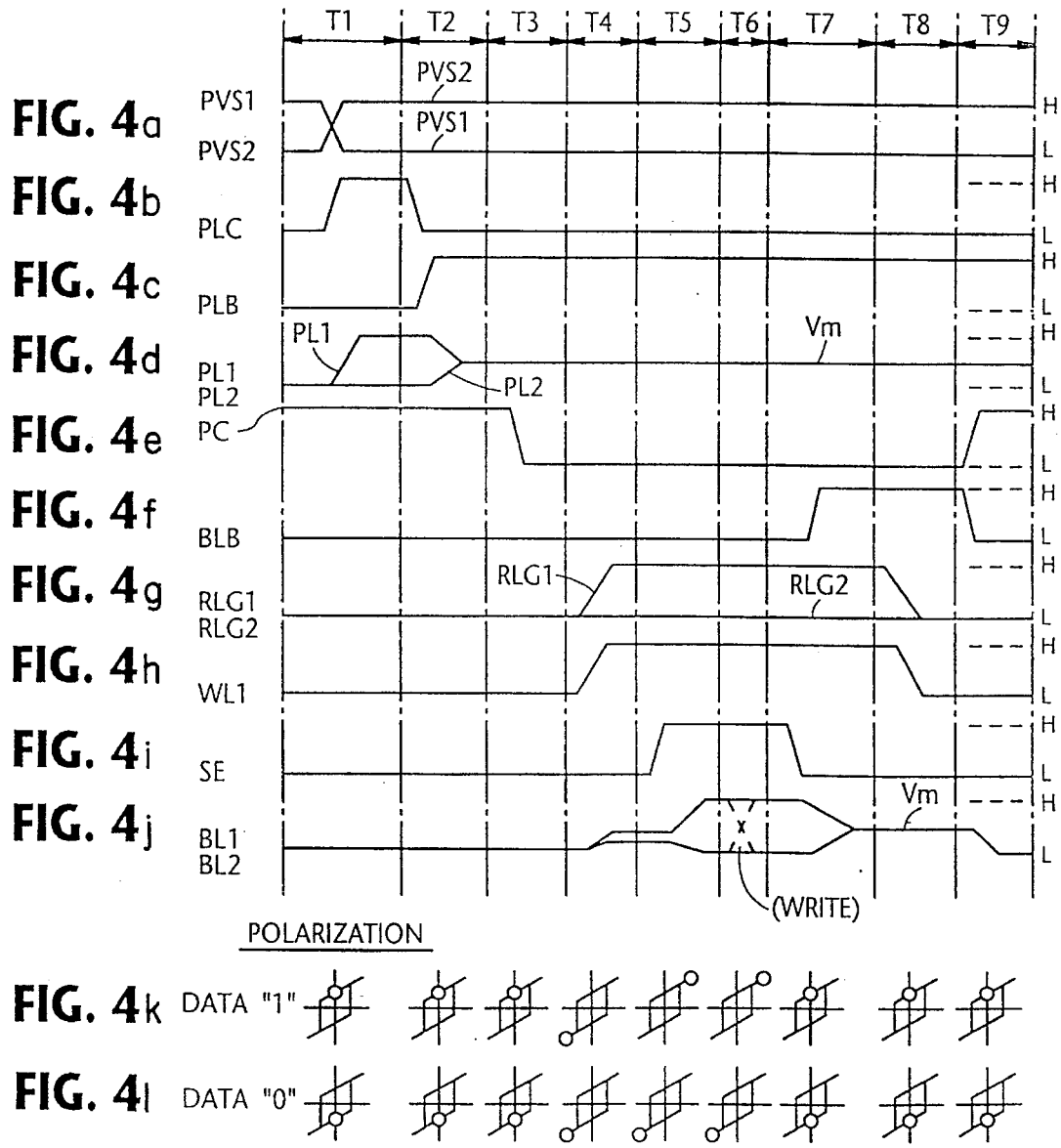
FIG. 4 is a timing diagram illustrating the operation of the memory of FIG. 3 in a nonvolatile mode.

FIG. 4 illustrates the operation of the memory of FIG. 3 in the nonvolatile mode, with respect to the memory cell 101 in the first memory block 100. The illustrations below the timing diagram show the state of polarization of the ferroelectric capacitor 12 of the memory cell 101 at the end of each period T1, T2, . . . , T9, for both the case of storing logic "1" and the case of storing logic "0".

Initially, i.e. in the standby state, bit lines BL1 and BL2 are precharged to low level "L" (ground potential), and plate lines PL1 and PL2 are kept at ground potential.

In period T1, plate line voltage supply signals PVS1 and PVS2 are changed to high level "H" and to low level, respectively, and plate line voltage supply control signal PLC is raised to high level. As a result, plate line PL1 is boosted to supply voltage $V_{cc}$ while plate line PL2 remains at ground potential. In period T2, control signal PLC is changed to low level, and switching command signal PLB is raised to high level. In consequence plate lines PL1 and PL2 are connected and kept at an intermediate voltage $V_m$, which is nearly the middle between supply voltage $V_{cc}$ and ground potential since plate lines PL1 and PL2 have nearly the same parasitic capacitance. Thus, periods T1 and T2 are transition periods precedent to read or write operation periods.

In period T3, precharge control signal PC is changed to low level to interrupt precharging of bit lines BL1 and BL2.

In period T4, word line WL1 is activated to high level to turn on the transistor 14 of the memory cell 101. At this point of time, plate line PL1 is at the intermediate voltage $V_m$ and bit line BL1 is at ground potential. Therefore, a voltage approximately equal to $-V_m$ (assuming that positive direction of voltage is the direction from plate line PL1 to bit line BL1) is impressed across the capacitor 12 of the memory cell 101. So, a signal voltage that corresponds to the polarization state of the capacitor develops on bit line BL1. That is, the data stored in the memory cell 101 is fed onto bit line BL1. At the same time, command signal RLG1 is supplied to the reference signal generation circuit 30 to change the potential of bit line BL2 to a predetermined reference level. In this period T4, the polarization state of the capacitor 12 of the memory cell 101 changes significantly. So, the memory cell loses the stored data.

In period T5, activation signal SE is shifted to high level to activate the sense amplifier 30. Then the sense amplifier 30 detects and amplifies the differential voltage between bit lines BL1 and BL2 to identify the data read out of the memory cell 101.

In the case of writing new data (externally inputted data) into the memory cell 101, writing is carried out in period T6 by developing voltages corresponding to the new data on bit lines BL1 and BL2.

In period T7, the sense amplifier 40 is deactivated by shifting activation signal SE to low level, and bit line balance command signal BLB is shifted to high level to change the potential of both bit lines BL1 and BL2 to the intermediate voltage $V_m$. By this operation the memory cell 101 is restored to the original state of polarization (in period T3) to regenerate the lost data.

In period T8, the potential of word line WL1 is lowered to low level to make the transistor 14 of the memory cell 101 nonconducting.

In period T9, bit line balance command signal BLB is shifted to low level to disconnect bit lines BL1 and BL2, and precharge control signal PC is shifted to high level to precharge bit lines BL1 and BL2 to ground potential. This is the end of a read and restoration cycle.

In the above described read and restoration operations during periods T3 to T9, the potential of plate lines PL1 and PL2 is fixed at the intermediate voltage $V_m$. That is, there is no need of clocked shifts of plate line potential. Therefore, operation speed can be enhanced, and power consumption can be reduced. According to the invention, the intermediate voltage $V_m$ is obtained by connecting a plate line PL1 kept at supply voltage $V_{cc}$ and another plate line PL2 kept at ground potential. By the conventional method the intermediate voltage $V_m$ for application to plate line is produced by lowering the supply voltage $V_{cc}$, whereby some waste of power is inevitable. In the present invention such waste of power is avoided.

Figure 5:
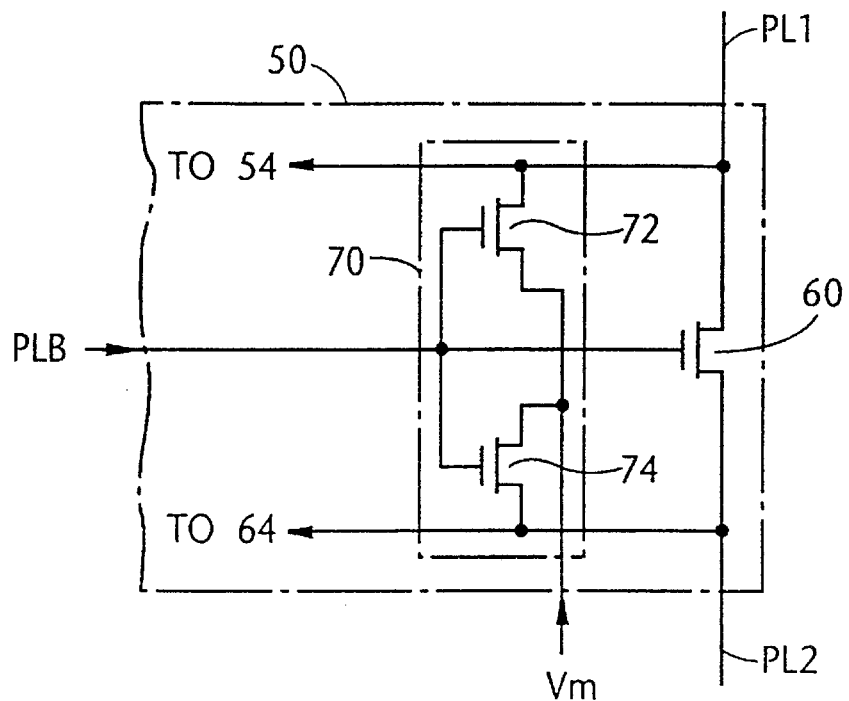
FIG. 5 shows a modification of a voltage control circuit in FIG. 3.
Figure 7:
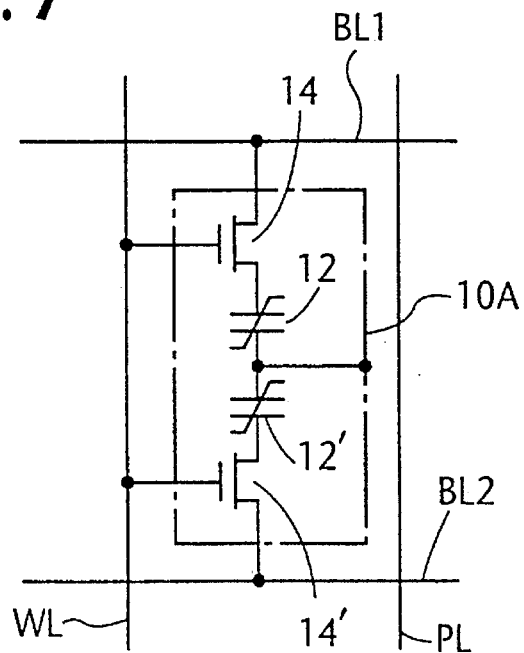
FIG. 7 is a circuit diagram of a known memory cell having two ferroelectric capacitors and two transistors.

In the process shown in FIG. 4 plate lines PL1 and PL2 assume a floating state in and after period T4. Therefore, the potential level of PL1 and PL2 might become unstable by leaks at indefinite locations. Referring to FIG. 5, as an option to stabilize the plate line potential, the plate line voltage control circuit 50 may include an intermediate voltage compensation circuit 70 having two transistors 72 and 74. The intermediate voltage $V_m$ on plate lines PL1 and PL2 is produced by connecting PL1 and PL2 as described hereinbefore. The function of the compensation circuit 70 is correcting small deviations of the voltage on plate lines PL1 and PL2 from $V_m$. To supply the voltage $V_m$ to the compensation circuit 70, it suffices to use a voltage generation circuit (not shown) which is small in both current drive capability and power consumption because there is no need of driving plate lines PL1 and PL2 from the level of supply voltage $V_{cc}$ or ground potential to the intermediate voltage $V_m$.

In the control circuit 50, the transistor 60 to control the connection and disconnection of plate lines PL1 and PL2 may be substituted by a transfer gate (not shown) constructed of a p-type transistor and an n-type transistor connected in parallel.

FIG. 6 illustrates the operation of the memory of FIG. 3 in the volatile mode, with respect to the memory cell 101 of the first memory block 100. It is assumed that the memory is precedingly operated in the nonvolatile mode as illustrated in FIG. 4.

In period T10 which follows the period T9 in FIG. 4, a precharge voltage VP (which is supplied to the precharge circuit 20 as indicated in FIG. 3) is set at the intermediate voltage $V_m$, and bit line balance signal BLB is shifted to high level to change the potential of both bit lines BL1 and BL2 to the intermediate voltage $V_m$. Furthermore, switching command signal PLB is shifted to low level to disconnect plate lines PL1 and PL2, and control signal PLC is changed to impress the first voltage (supply voltage $V_{cc}$) on one of plate lines PL1 and PL2 and the second voltage (ground potential) on the other plate line. (In FIG. 6 it is assumed that plate line PL1 is at ground potential. If plate line PL2 is kept at supply voltage, varying states of polarization of the memory cell 101 in the first memory block differ from the illustrations in FIG. 6. In that case, the states of polarization for data "1" are represented by 180-degree rotation of each of the illustrations in FIG. 6 for data "0", and the states of polarization for data "0" are represented by 180-degree rotation of each of the illustrations for data "1".)

In period T11, signals PC and BLB are shifted to low level to interrupt precharging of bit lines BL1 and BL2.

In period T12, word line WL1 is activated to high level to access the memory cell 101. Then, a current flows out of the capacitor 12 of the memory cell 101 onto bit line BL1 if the stored data is logic "1", and a current flows from bit line BL1 into the capacitor if the stored data is logic "0". The flow of current results in a change in the voltage on bit line BL1 and, hence, a voltage difference between bit lines BL1 and BL2.

In period T13, the sense amplifier 40 amplifies the difference voltage between bit lines BL1 and BL2 to identify the data read out of the memory cell 101.

In the case of writing new data into the memory cell 101, writing is carried out in period T13 by developing voltages corresponding to the new data on bit lines BL1 and BL2.

In period T15, word line WL1 is deactivated to low level. In period T16, bit lines BL1 and BL2 are precharged to the intermediate voltage $V_m$.

In the operation illustrated in FIG. 6 the potential of plate line PL1 is fixed at ground potential (or at supply voltage), and voltages on bit lines BL1 and BL2 vary between ground potential and supply voltage. That is, in this operation the voltages impressed across the two plates of the ferroelectric capacitor 12 are always in a specific direction. Therefore, there occurs no reversal of the direction of polarization of the ferroelectric in the capacitor 12, and for this reason repeated read or write operations do not cause fatigue of the dielectric film in the capacitor 12.

In this mode of operation the memory of FIG. 3 functions in the same manner as a conventional DRAM. In this mode the stored data is destructed if the power is turned off.

In the volatile mode operation, plate lines PL1 and PL2 are kept at ground potential and at supply voltage, respectively. This is convenient for a shift from the volatile mode to the nonvolatile mode because the intermediate voltage $V_m$ for plate lines PL1 and PL2 in the nonvolatile mode is obtained by merely connecting PL1 and PL2.

In the foregoing description of the operation of the memory of FIG. 3 in either the nonvolatile mode or the volatile mode, the first and second voltages (high and low levels) were supply voltage $V_{cc}$ and ground potential. In the case of using a positive voltage and a negative voltage as supply voltages for this memory, it is also possible to take the positive and negative supply voltages as the first and second voltages. In that case the intermediate voltage ($V_m$) may be set at ground potential.

What is claimed is:

1. A ferroelectric random-access memory comprising first and second memory blocks each of which comprises a plurality of memory cells arranged in rows and columns, each memory cell comprising a ferroelectric capacitor, which comprises first and second electrode plates and a ferroelectric material interposed between the two electrode plates, and a field effect transistor which is coupled at the source or drain to the first electrode plate of the capacitor, each memory block further comprising a plurality of word lines each of which is arranged along a row of memory cells and is coupled to the gate of said transistor in a plurality of memory cells in the row, a plurality of bit lines each of which is arranged along a column of memory cells and is coupled to the drain or source of said transistor in a plurality of memory cells in the column and a plate line which is coupled to the second electrode plate of said capacitor in every memory cell of the memory block, each memory block further comprising a precharging means for precharging the bit lines to one of first and second voltages which respectively correspond to the two levels of binary data, a plurality of sense amplifiers each of which senses a difference between a reference voltage and a signal voltage developed on a bit line by an accessed memory cell and amplifies the difference voltage to one of said first and second voltages and a balancing means for temporarily keeping the bit lines at an intermediate voltage between said first and second voltages after the amplification of said difference voltage, the memory further comprising a plate line voltage control means for keeping the plate line of each memory block at one of said first and second voltages during standby periods, changing the voltage on the plate line of one of the two memory blocks to the other of said first and second voltages and connecting the plate lines of the two memory blocks during a transition period preceding to an operation period to thereby keep the connected plate lines at said intermediate voltage and disconnecting the plate lines in a standby period following the operation period.

2. A memory according to claim 1, wherein said first and second voltages are ground potential and supply voltage, respectively.

3. A memory according to claim 1, wherein a plurality of memory cell pairs each of which is a combination of adjacently positioned first and second memory cells are arranged in rows and columns in each of the first and second memory blocks, each row of said memory cell pairs being provided with a first word line which is coupled to the first memory cells and a second word line which is coupled to the second memory cells, each column of said memory cell pairs being provided with a first bit line which is coupled to the first memory cells and a second bit line which is coupled to the second memory cells, each memory block further comprising, for each column of memory cell pairs, a reference voltage generation means for impressing said reference voltage on one of the first and second bit lines when a memory cell coupled to the other bit line is accessed, in each memory block one of said sense amplifiers being assigned to each column of memory cell pairs to sense and amplify a voltage difference between the first and second bit lines.

4. A memory according to claim 3, wherein said balancing means is provided to each column of memory cell pairs for connecting the first and second bit lines to temporarily keep the first and second bit lines at said intermediate voltage.

5. A memory according to claim 1, wherein said plate line voltage control means comprises a voltage stabilizing means for stabilizing said intermediate voltage on the connected plate lines by supplementally supplying the intermediate voltage to the plate lines.

6. A memory according to claim 1, wherein said plate line voltage control means comprises a field effect transistor of which the source-drain path connects the plate lines of the first and second memory blocks.

7. A memory according to claim 1, further comprising an auxiliary control means for operating the memory in a volatile mode without causing reversals of the direction of polarization of the ferroelectric material in the capacitors of the respective memory cells, said auxiliary control means comprising an auxiliary precharge means for precharging the bit lines to said intermediate voltage for a predetermined period of time, said plate line voltage control means comprising means for keeping the plate lines of the first and second memory block disconnected and at said first and second voltages, respectively, during operation in the volatile mode.

* * * * *